(12) United States Patent
Fiolka

(10) Patent No.: US 7,663,735 B2
(45) Date of Patent: Feb. 16, 2010

(54) MICROLITHOGRAPHIC PROJECTION EXPOSURE APPARATUS WITH IMMERSION PROJECTION LENS

(75) Inventor: Damian Fiolka, Oberkochen (DE)

(73) Assignee: Carl Zeiss SMT AG, Oberkochen (DE)

(*) Notice: Subject to any disclaimer, the term of this patent is extended or adjusted under 35 U.S.C. 154(b) by 297 days.

(21) Appl. No.: 11/488,412

(22) Filed: Jul. 18, 2006

(65) Prior Publication Data
US 2007/0024837 A1 Feb. 1, 2007

Related U.S. Application Data

(63) Continuation of application No. PCT/EP2004/001779, filed on Feb. 24, 2004.

(30) Foreign Application Priority Data
Jan. 19, 2004 (DE) ............ 10 2004 002 634

(51) Int. Cl.
  G03B 27/72 (2006.01)
  G03B 27/42 (2006.01)
  G03B 27/54 (2006.01)
(52) U.S. Cl. .................. 355/71; 355/53; 355/67
(58) Field of Classification Search .......... 355/53, 355/30, 55, 67, 71, 72, 77; 250/548
See application file for complete search history.

(56) References Cited

U.S. PATENT DOCUMENTS

| 4,346,164 A | 8/1982 | Tabarelli et al. |
| 5,715,039 A | 2/1998 | Fukuda et al. |
| 6,507,389 B1 * | 1/2003 | Yeh ................. 355/71 |
| 2001/0026360 A1 * | 10/2001 | Baker et al. ......... 355/77 |
| 2002/0008863 A1 * | 1/2002 | Taniguchi et al. ...... 355/55 |
| 2004/0114117 A1 * | 6/2004 | Bleeker .............. 355/53 |

FOREIGN PATENT DOCUMENTS

| WO | WO01/2907 A | 1/2001 |
| WO | WO03/092256 A2 | 11/2003 |

OTHER PUBLICATIONS

International Search Report PCT/EP2004/001779.

* cited by examiner

*Primary Examiner*—Peter B. Kim
(74) *Attorney, Agent, or Firm*—Young Basile

(57) ABSTRACT

A microlithographic projection exposure apparatus includes an illumination system and a projection lens which images a reticle onto a photosensitive layer. The projection exposure apparatus further includes an immersion arrangement for introducing an immersion liquid into an immersion interspace between a last optical element of the projection lens on the image side and the photosensitive layer. A transmission filter is designed and arranged in the projection lens in such a way that rays which enter the immersion interspace from the last optical element at an angle of incidence α are attenuated more strongly the smaller the angle of incidence α is. The transmission filter may be arranged e.g. in a pupil plane of the projection lens and may have a transmittance which increases with increasing distance from an optical axis of the projection lens. In this way compensation is provided for angle-dependent absorption in the immersion liquid.

10 Claims, 4 Drawing Sheets

MICROLITHOGRAPHIC PROJECTION EXPOSURE APPARATUS WITH IMMERSION PROJECTION LENS

This is a continuation of international application PCT/EP2004/001779 having an international filing date of Feb. 24, 2004. The full disclosure of this earlier application is incorporated herein by reference.

BACKGROUND OF THE INVENTION

The invention relates to a microlithographic projection exposure apparatus of the kind used for manufacturing large-scale integrated electrical circuits and other microstructured components. The invention further relates to a projection lens of such a microlithographic projection exposure apparatus and to a process for the microlithographic manufacture of microstructured components.

Projection exposure apparatuses project structures contained in a reticle onto a photosensitive layer which may be applied, for example, to a silicon wafer. One of the fundamental objectives in developing such projection exposure apparatuses is to be able to lithographically define structures of increasingly small dimensions on the photosensitive layer. Small structures give rise to high integration densities, which have a generally favorable effect on the efficiency of the microstructured components produced by means of such apparatuses. The size of the definable structures depends above all on the resolution of the projection lens used. Because the resolution of the projection lens is inversely proportional to the wavelength of the projection light, one approach to increasing resolution is to use projection light with shorter and shorter wavelengths. The shortest wavelengths currently used are in the ultraviolet spectral range and are of 193 nm and 157 nm. Another approach to increasing resolution is based on the concept of introducing an immersion liquid into the space intervening between the last lens of the projection lens on the image side and the photosensitive layer to be exposed. The immersion liquid preferably has the same refractive index as the photosensitive layer, whereby the numerical aperture is enlarged The projection exposure apparatus known from U.S. Pat. No. 4,346,164 has for this purpose an upwardly open container which holds the carrier with the photosensitive layer applied thereto. The container is filled with an immersion liquid and is so arranged that the last optical element of the projection lens on the image side can be immersed in the liquid.

It has been shown, however, that although resolution can be increased with the aid of the immersion method the contrast of the structures imaged on the photosensitive layer is often unsatisfactory.

SUMMARY OF THE INVENTION

It is therefore the object of the invention to provide a projection exposure apparatus with which the advantages of the immersion method can be exploited without having to accept significant losses in contrast.

In a projection exposure apparatus of the above-mentioned type this object is achieved in that the projection lens includes a transmission filter which is so designed and arranged in the projection lens that rays which enter the immersion interspace from the last optical element on the image side at an angle of incidence $\alpha$ are attenuated more strongly the smaller the angle of incidence $\alpha$ is.

The invention is based on the discovery that the immersion liquids which come into consideration, e.g. water or certain oils, are not completely transparent to the projection light used but have a significant absorption coefficient differing from zero. This causes a light ray passing through the immersion liquid to be absorbed more strongly the longer the path travelled by the light ray in the immersion liquid.

Because of the imaging characteristic of the projection lens, rays from different directions strike every image point on the photosensitive layer. Rays which enter the immersion interspace parallel to the optical axis are less strongly attenuated than rays which impinge on the image point concerned at an angle with respect to the optical axis. This is connected to the fact that the photosensitive layer is arranged in the image plane of the projection lens and is therefore flat. Consequently, for a ray which, starting from a point on the image-side face of the last optical element on the image side, passes through the immersion liquid, the path travelled in the immersion liquid is longer the larger the angle of incidence at which the ray enters the immersion interspace with respect to the optical axis. This is also the case, of course, if the point in question is located on a face which is not flat but curved.

If no corrective measures are taken, such an angle-dependent reduction of radiation intensity for rays impinging at an angle on an image point causes the entire imaging process to lose contrast.

With the transmission filter according to the invention, by contrast, rays of projection light which enter the immersion interspace at an angle of incidence $\alpha$ with respect to the optical axis are more strongly attenuated the smaller the angle of incidence $\alpha$. A lower overall dependence of radiation intensity on ray direction is thereby achieved. With appropriate design of the transmission filter it can even be achieved that the rays of projection light are attenuated in such a way that, for all arising angles of incidence $\alpha$, the rays have substantially the same radiation intensity on striking the photosensitive layer.

The transmission filter may be arranged, for example, at least approximately in a field plane, e.g. in the vicinity of the image plane, of the projection lens and have an angle-dependent transmittance which increases with increasing angles of the rays with respect to the optical axis.

Alternatively, a transmission filter in the form of a normal neutral density filter may be used which is arranged at least approximately in a pupil plane of the projection lens and the transmittance of which increases with increasing distance from an optical axis of the projection lens. This arrangement makes use of the fact that, with a transmission filter arranged in a pupil plane, rays which enter the immersion interspace at a predefined angle of incidence with respect to the optical axis can be attenuated in a specified manner.

For example, all principal rays, i.e. rays which intersect the optical axis in the pupil plane, exit the projection lens parallel to the optical axis and therefore impinge perpendicularly on the image plane. For this reason the principal rays travel the shortest distance in the immersion liquid and consequently are least attenuated in their radiation intensity by the immersion liquid. To compensate for this, the transmission filter preferably has the lowest transmittance in the region of the optical axis. As a result, the principal rays are most strongly attenuated by the transmission filter and are least attenuated by the immersion liquid. By contrast, rays which pass through regions of the pupil plane further removed from the optical axis impinge on the image plane at larger angles and are therefore subjected to stronger absorption by the immersion liquid. These rays are therefore less attenuated by the transmission filter.

On a transmission filter arranged in a pupil plane, each distance from the optical axis has associated with it a particular angle of incidence at which the rays enter the immersion interspace. To this extent the azimuth angle at which a ray passes through the transmission filter is immaterial. For this reason the transmittance of such a transmission filter can have a rotationally symmetrical progression with respect to the optical axis. In the case of a transmission filter arranged close to the field, the angular dependence of the transmission capability is preferably field-independent.

If the image-side face of the last optical element on the image side is disposed parallel to and at a distance d from the image plane, the dependence of attenuation on the angle of incidence α is preferably given by a transmission function T(α) which depends on the absorption constant k of the immersion liquid and on distance d.

In this case, the particular transmission function T(α) can be given by the equation $$T(\alpha) = T_0 \cdot \exp(kd/\cos(\alpha)),$$

where $T_0$ is a constant. This constant should preferably be selected such that for those rays of projection light which enter the immersion interspace 35 at the largest possible angle of incidence $\alpha_{max}$ with respect to the optical axis, the transmission filter has maximum transmittance, preferably approaching 100%. In this case the constant $T_0$ is given by $T_0 = \exp(-kd/\cos(\alpha_{max}))$.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and where.

Various features and advantages of the present invention may be more readily understood with reference to the following detailed description taken in conjunction with the accompanying drawing in which.

DESCRIPTION OF PREFERRED EMBODIMENTS

Figure 1:
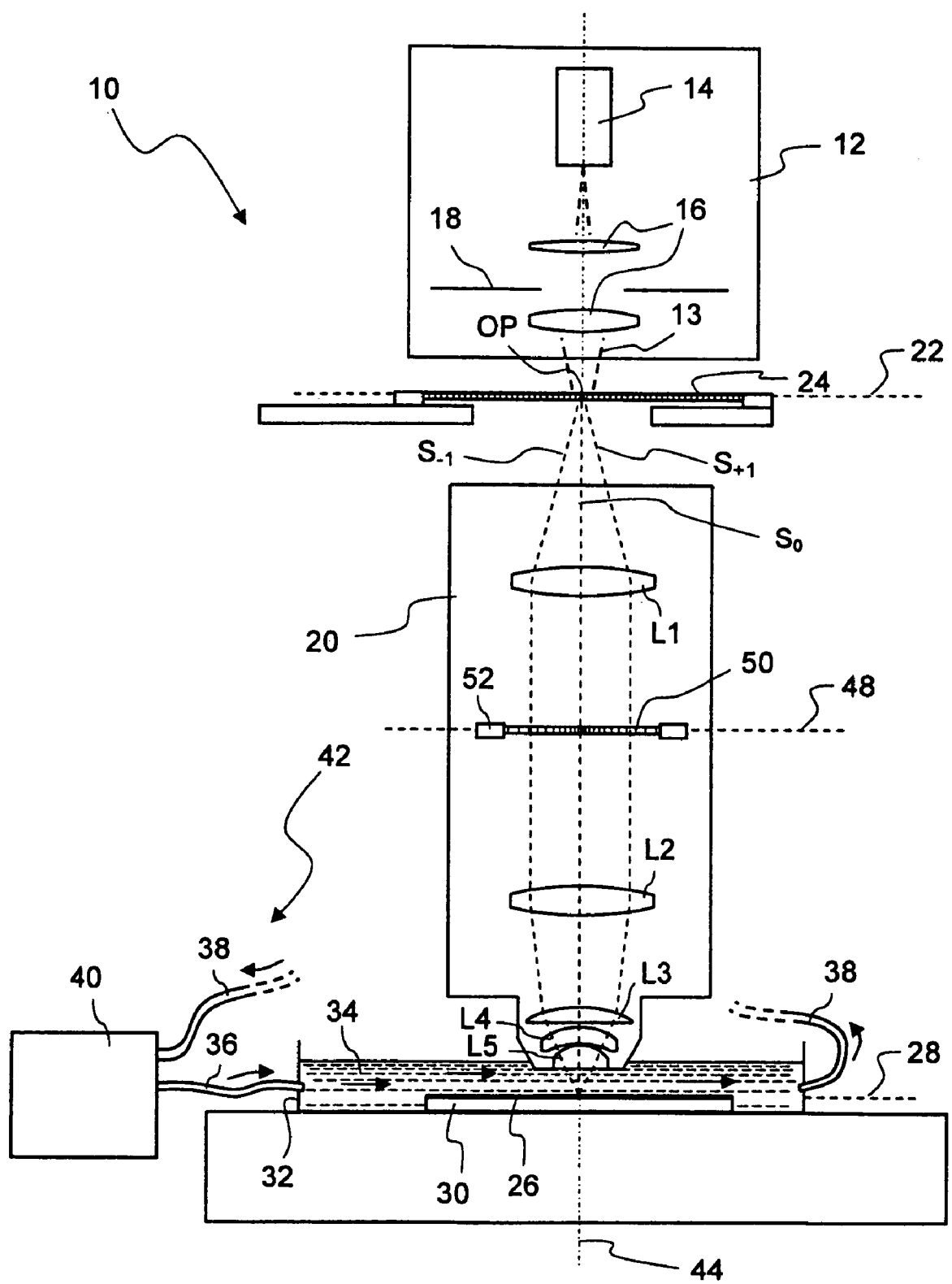
FIG. 1 shows a meridional section through a projection exposure apparatus according to the invention in a highly simplified representation which is not to scale.

FIG. 1 shows a meridional section through a microlithographic projection exposure apparatus designated as a whole by 10 in a highly simplified representation. The projection exposure apparatus 10 includes an illumination system 12 for generating projection light 13, which includes a light source 14, an illumination lens system indicated by 16 and a diaphragm 18. In the embodiment illustrated the projection light has a wavelength of 193 nm. The projection exposure apparatus 10 further includes a projection lens 20 containing a multiplicity of lenses, only some of which are indicated by way of example in FIG. 1 for the sake of clarity, and which are denoted by L1 to L5. The projection lens 20 is used to image a reticle arranged in an object plane 22 of the projection lens 20 on a reduced scale on a photosensitive layer 26 which is arranged in an image plane 28 of the projection lens and is applied to a carrier 30.

The carrier 30 is fixed to the bottom of an upwardly open vat-like container 32 which is movable parallel to the image plane 28 by means of a displacement device in a manner not illustrated in detail. The container 32 is filled with an immersion liquid 34 to a level at which the last lens L5 of the projection lens 20 on the image side is immersed in the immersion liquid 34 during operation of the projection exposure apparatus 10. Instead of a lens, the last optical element of the projection lens 20 on the image side may be e.g. a plane-parallel closing plate.

The container 32 is connected via a feed line 36 and a discharge line 38 to a processing unit 40 in which a circulation pump and a filter for cleaning immersion liquid 34 are contained. The processing unit 40, the feed line 36, the discharge line 38 and the container 32 together form an immersion arrangement denoted by 42 in which the immersion liquid 34 circulates while being purified and maintained at a constant temperature. The refractive index of the immersion liquid, which may be e.g. water or an oil, approximately coincides with the refractive index of the photosensitive layer 26. Through the immersion of the lens L5 in the immersion liquid 34 the projection lens can be designed with a larger numerical aperture, so that especially small structures can be defined on the photosensitive layer 26 using the projection exposure apparatus 10.

In the embodiment illustrated, the reticle 24 is a phase mask with which the structures contained therein influence, not the intensity, but the phase of projection light passing through same. Because the reticle 24 acts as a diffraction grating for the projection light 13, different orders of diffraction emanate from each point on the reticle. Moreover, the reticle 24 is so designed that substantially the totality of projection light 13 impinging on one point on the reticle 24 is diffracted into the diffraction orders m=0, m=+1 and m=−1.

This is illustrated in FIG. 1 for a point OP which is located on the optical axis 44 of the projection lens 20. The diffractive order m=0 corresponds to undiffracted projection light and is represented as the ray $S_0$, while the diffraction orders m=+1 and m=−1 are represented by diffracted rays $S_{+1}$ and $S_{-1}$. The further ray path of the rays $S_0$, $S_{+1}$ and $S_{-1}$ is indicated only schematically in the projection lens 20.

Figure 2:
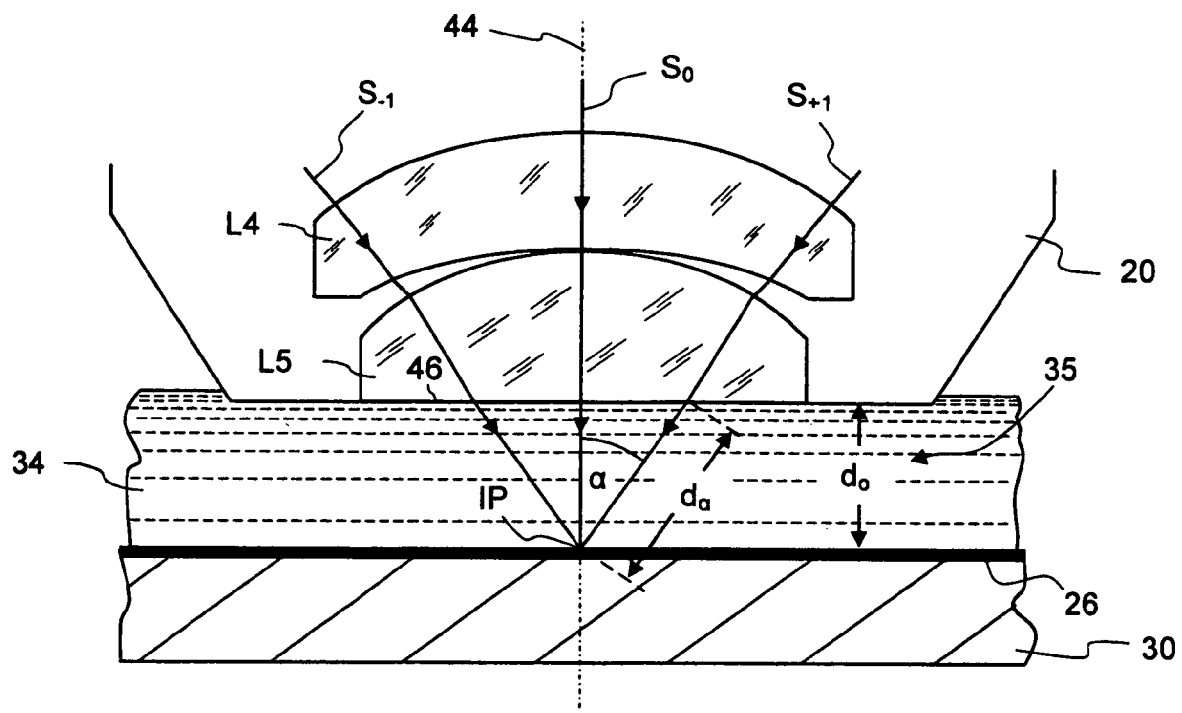
FIG. 2 shows an enlarged portion of the projection exposure apparatus represented in FIG. 1.

In FIG. 2 an enlarged portion of the end of the projection lens 20 on the image side is illustrated. It can be seen that the image-side plane face 46 of the last lens L5 of the projection lens 20 on the image side is immersed in the immersion liquid 34 which fills an immersion interspace 35 between the last lens L5 on the image side and the photosensitive layer 26. The ray $S_0$ which is disposed along the optical axis 44 travels the shortest possible distance $d_0$ in the immersion liquid 34, i.e. the distance between the photosensitive layer 26 and the plane face 46 of the lens L5 parallel thereto.

The two rays $S_{+1}$ and $S_{-1}$, by contrast, enter the immersion interspace 35 at an angle of incidence α with respect to the optical axis 44. Because of this oblique entry into the immersion interspace 35 the distance travelled therein is $d_\alpha$, where $$d_\alpha = d_0/\cos(\alpha) \tag{1}$$

Because the absorption coefficient k of the immersion liquid 34 is homogeneous and isotropic, the rays $S_{+1}$ and $S_{-1}$ are more strongly attenuated by the immersion liquid 34 because of the longer distance $d\alpha$, than the central ray $S_0$.

If the radiation intensity of the rays $S_0$, $S_{+1}$, and $S_{-1}$ on entering the immersion interspace 35 is $I_0$ in each case, their radiation intensity $I(\alpha)$ after passing through the immersion liquid 34 is yielded by $$I(\alpha) = I_0 \cdot \exp(-kd_0/\cos(\alpha)). \tag{2}$$

Through the greater attenuation of the rays $S_{+1}$ and $S_1$ inclined at an angle of incidence $\alpha$ with respect to the optical axis 44, therefore, less light from the orders of diffraction m=+1 and m=−1 reaches an image point IP on the photosensitive layer 26 than light from the diffractive order m=0. As a result the image produced on the photosensitive layer 26 has lower contrast than if the intensities of radiation were distributed uniformly over the orders of diffraction.

To ameliorate this situation and to achieve such uniformity a transmission filter 50 mounted in a filter holder 52 is arranged in a pupil plane 48 of the projection lens 20. The transmission filter 50, which is shown in a plan view in FIG. 3, has a transmittance which increases with increasing distance from the optical axis 44. In the plan view in FIG. 3 this is indicated by a plurality of concentric circles the spacing of which increases towards the outside In the transmission filter 50 shown as an example in FIG. 3 the transmittance T is rotationally symmetrical and is therefore a function only of the radial distance r from the optical axis 44:

$$T = T(R). \tag{3}$$

Because of the arrangement of the transmission filter 50 in the pupil plane 48, rays which pass through the transmission filter 50 at a relatively large distance from the optical axis 44 enter the immersion interspace 35 at a larger angle of incidence $\alpha$ than rays which pass through the transmission filter 50 close to the optical axis 44. Because the transmittance of the transmission filter 50 is lower in that region, the last-mentioned rays are attenuated more strongly than rays which enter the immersion interspace 35 at a larger angle of incidence $\alpha$ with respect to the optical axis. In this way it is achieved that the attenuation according to equation (2), which increases with increasing angle of incidence $\alpha$, is overlaid by an attenuation generated by the transmission filter 50, which decreases with increasing angle of incidence $\alpha$. As a result, more uniform overall radiation intensity for the rays of the different diffractive orders is produced.

The intensity of radiation becomes especially uniform if the product of the attenuation resulting from absorption in the immersion liquid 34 according to equation (2) and the attenuation resulting from absorption in the transmission filter 50 is a constant:

$$T(\alpha) \cdot I(\alpha) = \text{const.} \tag{4}$$

In this equation $T(\alpha)$ designates the transmittance of the transmission filter 50 as a function of the angle of incidence $\alpha$ at which the rays enter the immersion interspace 35.

From equations (3) and (4) the transmittance $T(\alpha)$ is then yielded as $$T(\alpha) = T_0 \cdot \exp(-kd_0/\cos(\alpha)). \tag{5}$$

So that as little projection light 13 as possible is absorbed overall by the transmission filter 50 the constant $T_0$ is preferably so defined that, at least for the rays which enter the immersion interspace 35 at the largest possible angle of incidence $\alpha_{max}$, the transmission filter has a highest possible transmittance, preferably $T(\alpha_{max}) \approx 1$. Insertion into the equation (5) then yields for the constant $T_0$ the relation $$T_0 = \exp(-kd_0/\cos(\alpha_{max})). \tag{6}$$

Figure 4:
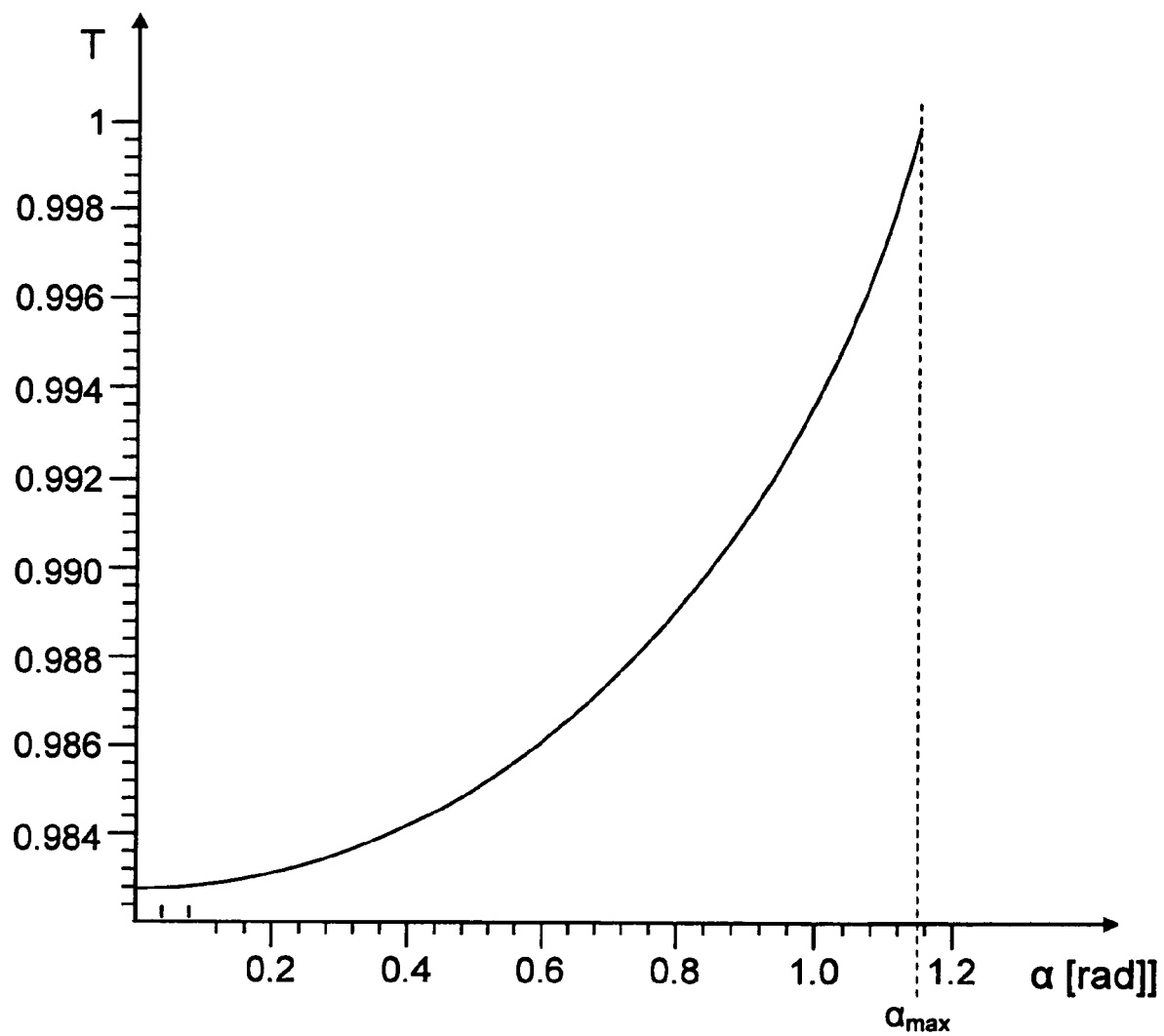
FIG. 4 shows a graph in which the attenuation generated by the transmission filter shown in FIG. 3 is plotted in dependence on the angle of incidence with respect to the optical axis with which projection light enters an immersion interspace.

In FIG. 4 the progression of transmittance $T(\alpha)$ is plotted as a function of the angle of incidence $\alpha$ at which the rays enter the immersion interspace 35 with respect to the optical axis. It has been assumed that the distance from the surface 46 of the lens L5 to the photosensitive layer 26 $d_0$=4 mm. The calculation is based further on the assumption that water is used as the immersion liquid 34 and is exposed to projection light having a wavelength of 193 nm. The absorption coefficient k is then k=0.0321 1/cm. A value of 65° was used for the maximum arising angle of incidence $\alpha_{max}$.

It can be seen from the graph in FIG. 4 that transmittance $T(\alpha)$ has the exponential progression yielded by equation (5). In terms of absolute values, however, the increase is relatively small, since even for an angle of incidence $\alpha$=0° the transmittance is still greater than 0.982.

Figure 3:
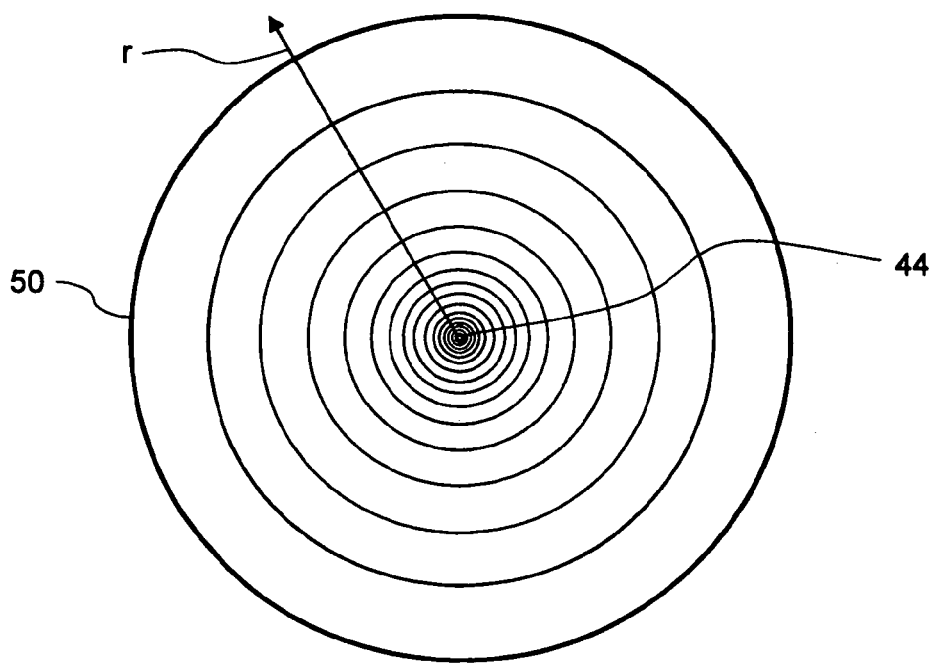
FIG. 3 is a plan view of a transmission filter which has transmittance increasing radially towards the outside.

It should be noted in this connection that the transmittance progression $T(\alpha)$ represented in FIG. 4 is not identical to the radial transmittance progression $T(r)$, as indicated schematically in FIG. 3. The relation between radial distances r and angles of incidence $\alpha$ is predefined by the concrete design of the projection lens 20 and cannot be generalised without further specification. Qualitatively, however, the radial transmittance $T(r)$ has a similar progression to the transmittance $T(\alpha)$ represented in FIG. 4.

Figure 5:
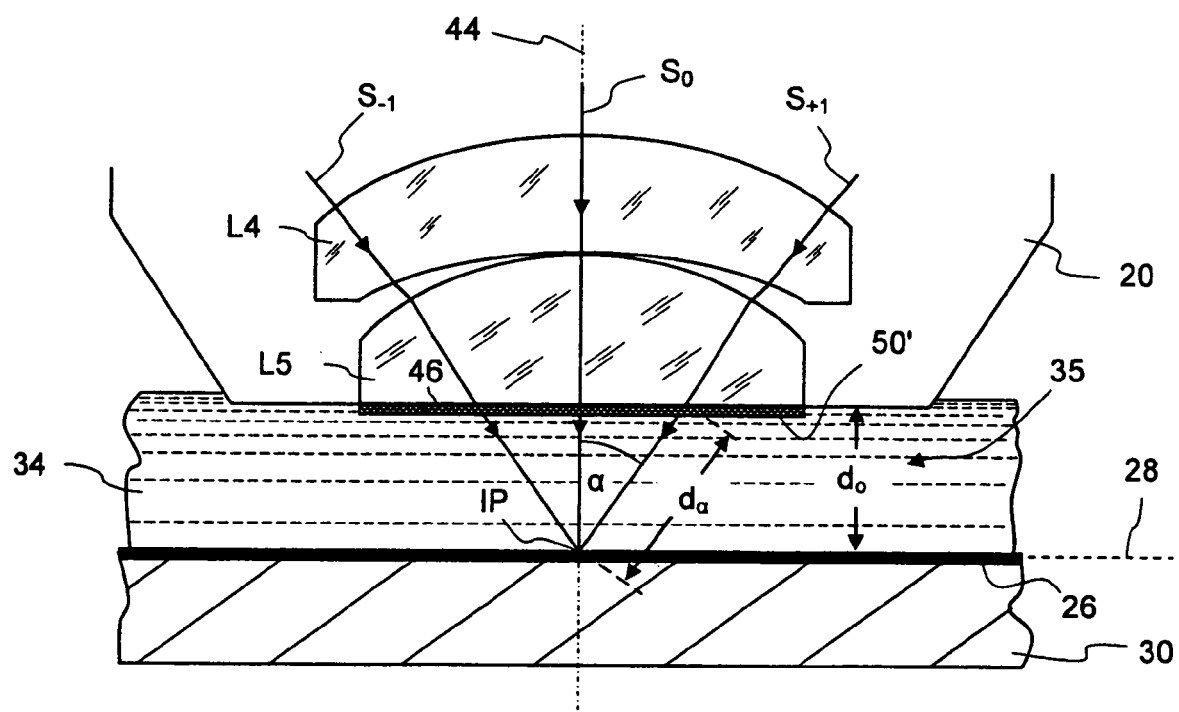
FIG. 5 shows an enlarged portion of a projection exposure apparatus according to a different embodiment in a representation analogous to that in FIG. 2.

FIG. 5 shows in an enlarged section, in a representation analogous to FIG. 2, the image-side end of a projection lens according to a different embodiment of the invention. Parts identical to those in the above-described projection lens are denoted by the same reference characters.

A transmission filter 50' having angle-dependent transmission capability is fixed (in a manner not represented in detail) to the plane face 46 of the last optical element L5 on the image side. The transmission filter 50' is therefore arranged close to the field, i.e. in the vicinity of the image plane 28. Angle-dependent transmission filters which are arranged in a field plane and which cause angle-dependent attenuation are described in WO 03/02256 of the applicant, the disclosure content of which is included in its full extent in this application.

The angular dependence of the transmission capability is so designed in the case of transmission filter 50' that rays which enter the immersion interspace 35 at a larger angle of incidence $\alpha$ are attenuated less strongly than rays which enter the immersion interspace 35 at a smaller angle of incidence $\alpha$. With appropriate design of the angular dependence it can be achieved in this case, too, that all rays impinge on the photosensitive layer 26 with approximately the same intensity.

Alternatively the transmission filter 50' may be arranged in a field plane conjugate to the image plane 28, e.g. in the vicinity of the object plane 22 or in an intermediate image plane—if present—of the projection lens 20.

What is claimed is:

1. A microlithographic projection exposure apparatus, comprising:
   a) an illumination system for generating projection light;
   b) a projection lens for imaging a reticle arranged in an object plane of the projection lens onto a photosensitive layer, which is arranged in an image plane of the projection lens and is applied to a carrier, said projection lens comprising a last optical element on the image side;

c) an immersion arrangement for introducing an immersion liquid into an immersion interspace formed between the last optical element and the photosensitive layer; and
d) a transmission filter which is designed and arranged in the projection lens in such a way that all rays, which leave the last optical element and enter the immersion interspace at an angle of incidence α, are attenuated more strongly the smaller the angle of incidence α is.

2. The apparatus of claim 1, wherein the transmission filter is arranged at least approximately in a field plane of the projection lens and has an angle-dependent transmittance which increases with increasing ray angles with respect to an optical axis of the projection lens.

3. The apparatus of claim 1, wherein the transmission filter is arranged at least approximately in a pupil plane of the projection lens, and wherein the transmission filter has a transmittance distribution which is rotationally symmetrical with respect to an optical axis of the projection lens.

4. The apparatus of claim 1, wherein the transmission filter attenuates rays of projection light in such a way that for all occurring angles of incidence α the rays have substantially the same radiation intensity when impinging on the photosensitive layer.

5. The apparatus of claim 1, wherein the dependence of attenuation on the angle of incidence α is given by a transmission function $T(\alpha)$ which depends on an absorption constant k of the immersion liquid and on a distance d between the last optical element of the projection lens on the image side and the photosensitive layer.

6. The apparatus of claim 5, wherein the transmission function $T(\alpha)$ is at least approximately given by $T(\alpha)=T_0\exp(-kd/\cos(\alpha))$, where $T_0$ is a constant.

7. The apparatus of claim 6, wherein the constant $T_0$ is at least approximately given by $T_0=\exp(-kd/\cos(\alpha_{max}))$, where $\alpha_{max}$ is a maximum angle of incidence at which rays enter the immersion interspace.

8. A microlithographic projection exposure apparatus, comprising:

an illumination system for generating projection light;
a projection lens for imaging a reticle arranged in an object plane of the projection lens onto a photosensitive layer, which is arranged in an image plane of the projection lens and is applied to a carrier, said projection lens having an optical axis and comprising a last optical element on the image side;
an immersion arrangement for introducing an immersion liquid into an immersion interspace formed between the last optical element and the photosensitive layer; and
a transmission filter which is arranged at least approximately in a pupil plane of the projection lens and has a transmittance that increases with increasing distance from an optical axis of the projection lens, so that all rays, which leave the last optical element and enter the immersion interspace at an angle of incidence α, are attenuated more strongly the smaller the angle of incidence α is.

9. The apparatus of claim 8, wherein the transmission filter has a transmittance distribution which is rotationally symmetrical with respect to the optical axis of the projection lens.

10. A microlithographic projection exposure apparatus, comprising:
a) an illumination system for generating projection light;
b) a projection lens for imaging a reticle arranged in an object plane of the projection lens onto a photosensitive layer, which is arranged in an image plane of the projection lens and is applied to a carrier, said projection lens comprising a last optical element on the image side;
c) an immersion arrangement for introducing an immersion liquid into an immersion interspace formed between the last optical element and the photosensitive layer; and
d) a transmission filter which is arranged at least approximately in a field plane of the projection lens and has an angle-dependent transmittance which increases with increasing ray angles with respect to an optical axis of the projection lens, so that all rays, which leave the last optical element and enter the immersion interspace at an angle of incidence α, are attenuated more strongly the smaller the angle of incidence α is.

* * * * *